(12) United States Patent
Choi

(10) Patent No.: US 8,039,965 B2
(45) Date of Patent: Oct. 18, 2011

(54) SEMICONDUCTOR DEVICE WITH REDUCED LAYOUT AREA HAVING SHARED METAL LINE BETWEEN PADS

(75) Inventor: Hyun Seung Choi, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 729 days.

(21) Appl. No.: 12/042,486

(22) Filed: Mar. 5, 2008

(65) Prior Publication Data

US 2009/0160530 A1  Jun. 25, 2009

(30) Foreign Application Priority Data

Dec. 21, 2007  (KR) .................. 10-2007-0135569

(51) Int. Cl.
*G11C 5/14*  (2006.01)
(52) U.S. Cl. ........................................ 257/773; 327/530
(58) Field of Classification Search .......... 257/355–360; 361/56
See application file for complete search history.

(56) References Cited

U.S. PATENT DOCUMENTS

| | | | | |
|---|---|---|---|---|
| 6,249,410 | B1 * | 6/2001 | Ker et al. ..................... | 361/56 |
| 7,411,767 | B2 * | 8/2008 | Huang et al. .................. | 361/56 |
| 2003/0235019 | A1 * | 12/2003 | Ker et al. ..................... | 361/56 |

FOREIGN PATENT DOCUMENTS

| | | |
|---|---|---|
| JP | 2001-358223 A | 12/2001 |
| KR | 1020010048211 A | 6/2001 |
| KR | 1020050022879 A | 3/2005 |
| KR | 1020070077519 A | 7/2007 |

* cited by examiner

*Primary Examiner* — Steven Loke
*Assistant Examiner* — David Ziskind
(74) *Attorney, Agent, or Firm* — Ladas & Parry LLP

(57) ABSTRACT

A semiconductor device with a reduced layout area includes pads disposed between a first voltage line and a second voltage line; first and second driver units adjacently disposed at an upper portion or a lower portion of the respective pads; and a metal line disposed between the pads and supplying power commonly to the first and second driver units.

15 Claims, 3 Drawing Sheets

SEMICONDUCTOR DEVICE WITH REDUCED LAYOUT AREA HAVING SHARED METAL LINE BETWEEN PADS

CROSS-REFERENCE TO RELATED APPLICATIONS

The present application claims priority to Korean patent application number 10-2007-0135569 filed on Dec. 21, 2007, which is incorporated herein by reference in its entirety.

BACKGROUND OF THE INVENTION

The present invention relates to a semiconductor device, and more particularly to a semiconductor device with a reduced layout area having a shared metal line between pads.

The fast-paced advancement of semiconductor technologies is evidenced in rapidly increasing memory capacity processing speed.

In general, pads are placed in a peripheral region of a semiconductor chip to allow electrical connection between the chip and the outside. These pads are used to input or output the signals to/from the chip such as the signals related to address, command input, read and write operations, etc. Each of these pads connected to the internal circuit of the chip is connected to the package pin via a wire bonding.

Each of these pads is provided with a vicinity circuit region adjacent thereto. Each vicinity circuit region is the area set aside to accommodate the circuits connect directly to the pad, for example, an electrostatic discharge unit, a data output driver circuit, an on-die termination (ODT) circuit, and the like. Each pad's use or purpose is determined by the connection made of the pad and the circuit provided in the vicinity circuit area, and further the pad is packaged in the manner suitable for the packaging required by a user.

FIG. 1A shows an electrostatic discharge unit formed at a periphery region of a pad, and FIG. 1B shows a layout of the electrostatic discharge unit shown in FIG. 1A.

Referring to FIG. 1A, an electrostatic discharge unit 20 disposed between a pad 10 and an internal circuit 40, and a power clamp unit 30 disposed between a power voltage VDD line 1 and a ground voltage VSS line 2 are comprised in a semiconductor device.

In the electrostatic discharge unit 20, a diode 21 connected to the power voltage VDD line 1 and a diode 22 connected to the ground voltage VSS line 2 are connected in series. When static electricity is inputted into the pad, the static electricity is discharged through the power voltage VDD line 1 or the ground voltage VSS line 2. The power clamp unit 30 is formed between the power voltage VDD line 1 and the ground voltage VSS line 2 and is turned on to protect the device when the voltage is rapidly changed by an electrostatic input.

FIG. 1B is a layout of the electrostatic discharge unit of FIG. 1A. However, FIG. 1B is not shown with the details of the electrostatic discharge unit 20 and the power clamp 30, because they are deemed to be apparent to one of ordinary skills in the pertinent art. Instead, FIG. 1B is drawn to show with emphasis the metal lines and contacts related to power supply.

Referring to FIG. 1B, the electrostatic discharge units 21, 22, 23, 24 and power clamp units 31, 32, 33, 34 are disposed at the upper portion and lower portion of the pads 10 and 11. The metal lines 41, 42, 43, 44 are disposed to apply bias to the power clamp units 31, 32, 33, 34.

The diodes 21, 22 of the electrostatic discharge unit 20 are formed to be overlapped with the pad 10 and are connected to the power voltage VDD line 1 or the ground voltage VSS line 2 through a contact. Specifically, one side of the first diode 21 is connected to the power voltage VDD line 1, and the other side of the first diode 21 is connected to the ground voltage VSS line 2. In other words, an N-type impurity region of the first diode 21 is connected to the VDD line 1 at the lower portion thereof through the contact, and a P-type impurity region of the first diode 21 is connected to the pad 10 through a metal option (not shown). Therefore, the first diode 21 can protect the circuit by discharging static electricity applied to the pad to the power voltage VDD line 1. Likewise, a P-type impurity region of the second diode 22 is connected to the ground voltage VSS line 2 through the contact, and an N-type impurity region of the second diode 22 is connected to the pad 10 through a metal option (not shown).

Next, with respect to the power clamp unit 30, the power clamp unit 30 in FIG. 1A corresponds to power clamp units 31, 32 in FIG. 1B. The first power clamp unit 31 is formed with a contact at a portion thereof overlapped with the power voltage VDD line 1 and is supplied with the power voltage VDD. Also, the first power clamp unit 31 is connected to the ground voltage VSS line 2 through the metal line 41. Likewise, the second power clamp unit 32 is formed with a contact at a portion thereof overlapped with the ground voltage VSS line 2 to be supplied with the ground voltage VSS, and the second power clamp unit 32 is supplied with the power voltage VDD through the metal line 42.

A drain terminal of the first power clamp unit 31 is supplied with the power voltage VDD through the contact formed at the portion overlapped with the power voltage VDD line 1 and a source terminal of the first power clamp unit 31 is supplied with the ground voltage VSS through the metal line 41. Also, a drain terminal of the second power clamp unit 32 is supplied with the power voltage VDD through metal line 42, and a source terminal of the second power clamp unit 32 is supplied with the ground voltage VSS through the contact formed at the portion overlapped with the ground voltage VSS line 2.

Further, the electrostatic discharge units 23, 24 and the power clamp units 33, 34 are disposed at a periphery of the pad 11, and the metal lines 43, 44 are formed so as to apply bias to the power clamp units 33, 34.

Generally, wiring of more than 6 µm width is used for the metal lines 41, 42, 43, 44. However, since signal lines are more and more increasing as semiconductor devices are more miniaturized and operate at higher speed, it is very difficult to ensure a space for disposing the metal lines for the power supply.

Uniticularly, according to the prior art, since two power lines exist within a pitch between the pads, it is very difficult to allocate a space for disposing the signal line.

SUMMARY OF THE INVENTION

Accordingly, the present invention provides a semiconductor device in which only one power line is disposed between pads and thus a space occupied by the power line can be reduced and a cell efficiency can be raised.

According to a first aspect of the present invention, there is provided a semiconductor device, which includes: pads disposed between a first voltage line and a second voltage line; first and second driver units adjacently disposed at an upper portion or a lower portion of the respective pads; and a metal line disposed between the pads and supplying power commonly to the first and second driver units.

Preferably, the metal line is formed with a first metal contact for an electrical connection with the first voltage line at one side of the metal line and a second metal contact for an electrical connection with the first and second driver units at the other side of the metal line.

Preferably, the first voltage line is a power voltage line, and the second voltage line is a ground voltage line, or vice versa.

Preferably, the driver unit comprises a power clamp circuit which is turned on to form a current path when a static electricity is applied to the first or second voltage line.

According to a second aspect of the present invention, there is provided a semiconductor device, which includes: first and second pads disposed between a first voltage line and a second voltage line; a first driver unit formed at an upper portion of the first pad; a second driver unit formed at a lower portion of the first pad in a diagonal direction of the first driver unit; a third driver unit formed adjacently to the first driver unit at an upper portion of the second pad; a fourth driver unit formed at a lower portion of the second pad in a diagonal direction of the third driver unit; and a metal line disposed between the first and second pads and supplying the second voltage to the first and third driver units.

Preferably, the metal line is formed with a first contact for an electrical connection with the first and third driver units at one side of the metal line and a second contact for an electrical connection with the second voltage line at the other side of the metal line.

Preferably, each of the first and third driver units is formed with a contact overlappedly disposed on the first voltage line and supplied a voltage from the first voltage line.

Preferably, each of the second and fourth driver units is formed with a contact overlappedly disposed on the second voltage line and supplied a voltage from the second voltage line.

Preferably, each of the first through fourth driver units comprises a power clamp circuit which is turned on to form a current path when static electricity is applied to the first or second voltage line.

According to a third aspect of the present invention, there is provided a semiconductor device, which includes: pads spacedly disposed between a first voltage line and a second voltage line; a plurality of first driver units formed at upper portions of the pads; a plurality of second driver units formed at lower portions of the pads; a first metal line formed between the pads and supplying a second voltage to the first driver units; and a second metal line formed between the pads and supplying a first voltage to the second driver units.

Preferably, the first driver unit comprises a pair of drivers which share the first metal line and are supplied with the second voltage from the first metal line.

Preferably, the second driver unit comprises a pair of drivers which share the second metal line and are supplied with the first voltage from the second metal line.

Preferably, the first and second driver units are disposed in a diagonal direction.

Preferably, each of the first and second driver units comprises a power clamp circuit, which is turned on to form a current path when static electricity is applied to the first or second voltage line.

According to the present invention, since the power line is disposed by only one between the pads, a space occupied by the power line can be reduced.

Also, according to the present invention, since a space occupied by the power line can be reduced, a distance between the pads can be reduced, a cell efficiency can be raised and the semiconductor device can be more miniaturized.

DESCRIPTION OF SPECIFIC EMBODIMENTS

The present invention directed to a layout in which only one power line for supplying power to a driver circuit is formed one between pads and the both pads can share the power line.

Hereinafter, preferred embodiments of the present invention will be described in detail with reference to the accompanying drawings.

Figure 1A:
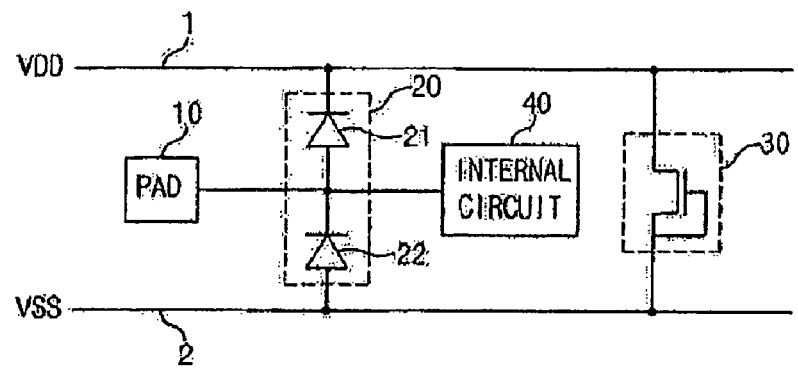
FIGS. 1A and 1B are respectively a circuit diagram and a layout showing a semiconductor device according to a prior art.
Figure 1B:
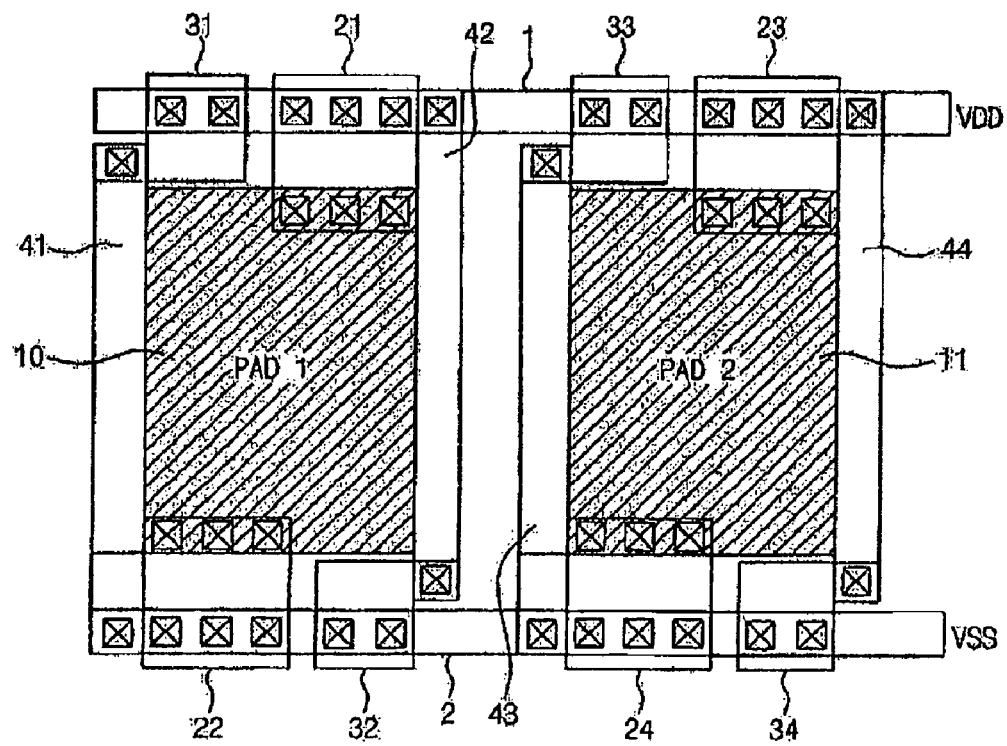
Figure 2:
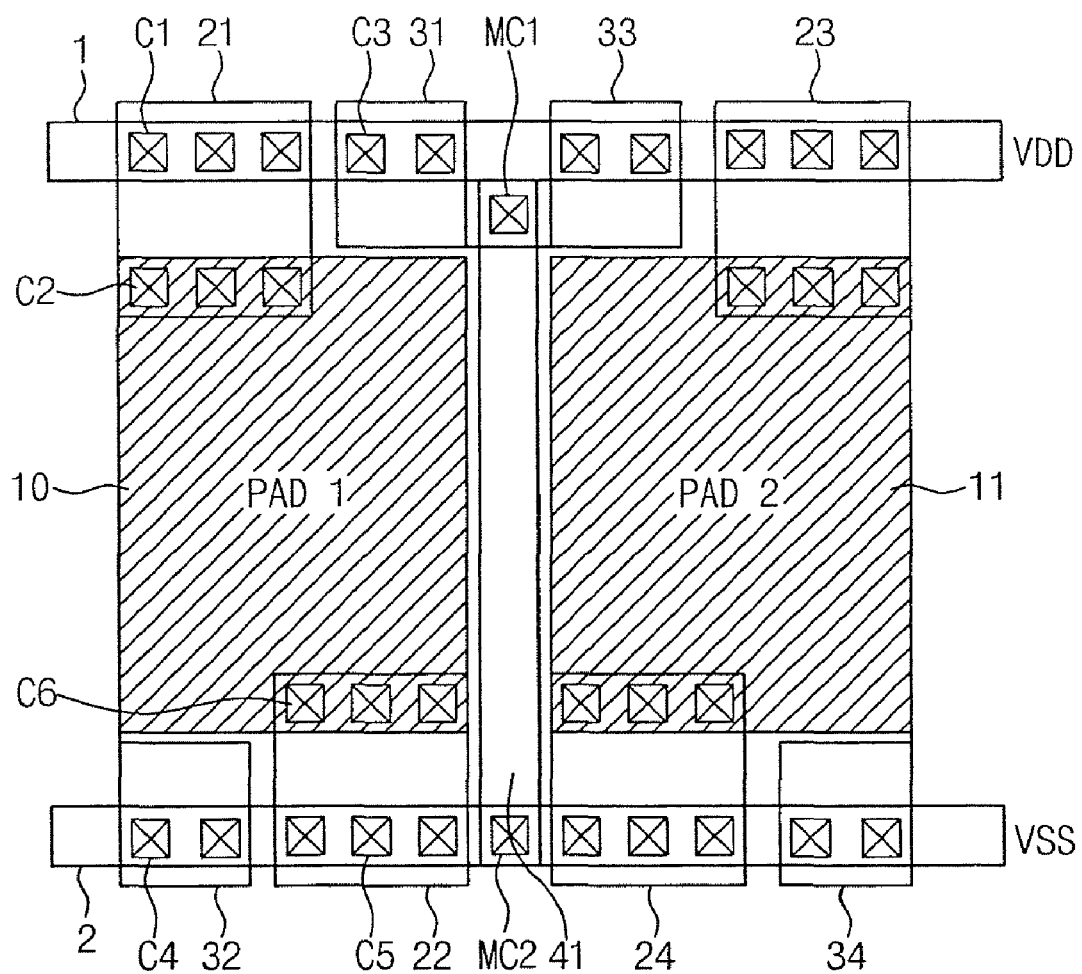
FIG. 2 is a layout of a semiconductor device according to one embodiment of the present invention.

FIG. 2 is a schematic layout of a semiconductor device according to an embodiment of the present invention.

As shown in the drawings, in a semiconductor device according to an embodiment of the present invention, a plurality of pads 10, 11 is disposed between a power voltage VDD line 1 and a ground voltage VSS line 2. A metal line 41 connected to the ground voltage VSS line 2 through a contact MC2 is formed between the pads.

Electrostatic discharge units 21, 22, 23, 24 and power clamp units 31, 32, 33, 34 are disposed at the peripheries of the pads 10, 11, and the power clamp units 31, 33 share the metal line 41.

More specifically, a first electrostatic discharge unit 21 and a first power clamp unit 31 are formed at an upper portion of the first pad 10, and a second electrostatic discharge unit 22 and a second power clamp unit 32 are formed at a lower portion of the first pad 10.

It is preferable that the electrostatic discharge units 21, 22 and the power clamp units 31, 32 are disposed in a diagonal direction as shown in FIG. 2, respectively.

The first electrostatic discharge unit 21 is formed with a first contact C1 at a portion thereof overlapped with the power voltage VDD line 1 and is applied with the power voltage VDD. Also, the first electrostatic discharge unit 21 is formed with a second contact C2 at a portion thereof overlapped with the pad 10 and thus is connected with the pad 10. Preferably, the first contact C1 is formed at a lower portion of an N-type impurity region of a diode, and the second contact C2 is formed at a lower portion of a P-type impurity region of the diode. The second contact C2 may be connected to the pad 10 through a metal option (not shown).

The second electrostatic discharge unit 22 is formed with a fifth contact C5 at a portion thereof overlapped with the ground voltage VSS line 2 and is supplied with ground voltage VSS. Also, the second electrostatic discharge unit 22 is formed with a sixth contact C6 at a portion thereof overlapped with the pad 10 and thus is connected with the pad 10. Preferably, the fifth contact C5 is formed at a lower portion of a P-type impurity region of a diode and the sixth contact C6 is formed at an N-type impurity region of the diode.

With the structure as above, the N-type impurity region of the first electrostatic discharge unit 21 is connected to the power voltage VDD line 1, and the P-type impurity region thereof is connected to the pad 10. Therefore, when the external static electricity is applied to the pad 10 and thus sudden current flows, the static electricity is discharged to the power voltage VDD line 1.

The power clamp units 31, 32 are also formed with contacts C3, C4 at portions overlapped with the voltage lines and thus applied with the power voltage VDD or the ground voltage VSS, respectively.

A first power clamp 31 is formed with a third contact C3 at a portion thereof overlapped with the power voltage VDD line 1 and is supplied with the power voltage VDD. Also, the first power clamp 31 is supplied with the ground voltage VSS through the metal line 41 connected to the ground voltage VSS line 2.

One side of the metal line 41 is connected to the first power clamp unit 31 through a first metal contact MC1, and the other side of the metal line 41 is connected to the ground voltage VSS line 2 through a second metal contact MC2. Therefore, the ground voltage VSS is supplied to the first power clamp unit 31 through the metal line 41.

Next, a circuit at a periphery of the pad 11 and a voltage supply will be described.

At a periphery of the pad 11, similar to the above description, a third electrostatic discharge unit 23 and a fourth electrostatic discharge unit 24 are disposed in a diagonal direction at upper and lower portion of the pad 11. A third power clamp unit 33 and a fourth power clamp unit 34 are also disposed in a diagonal direction at upper and lower portion of the pad 11.

The third power clamp 33 is disposed adjacent to the metal line 41 since it should be supplied with the ground voltage VSS through the metal line 41. In other words, the third power clamp unit 33 is disposed so as to be adjacent to the first power clamp unit 31 and thus shares the metal line 41 with the first power clamp unit 31.

A method of supplying power is the same as those described above in relation to the pad 10 and thus will not be described.

The power clamp units 31, 33 formed at the upper portions of the pads 10, 11 are supplied with the power voltage VDD from the power voltage VDD line 1 overlappedly disposed therebelow and the ground voltage VSS from the ground voltage VSS line 2 disposed at the other side through the metal line 41.

Further, although not shown, the second power clamp unit 32 shares a single metal line with an adjacent power clamp unit and is supplied with the power voltage VDD through the shared metal line. Likewise, the fourth power clamp unit 34 is also supplied with the power voltage VDD through a shared metal line (not shown).

Although the power clamp units share one metal line formed between the pads in the present embodiment, it is not necessary to limit to the power clamp units. The present invention may be applied to every circuit of semiconductor devices, which is disposed at upper or lower portion of the pad and supplied with power.

Figure 3:
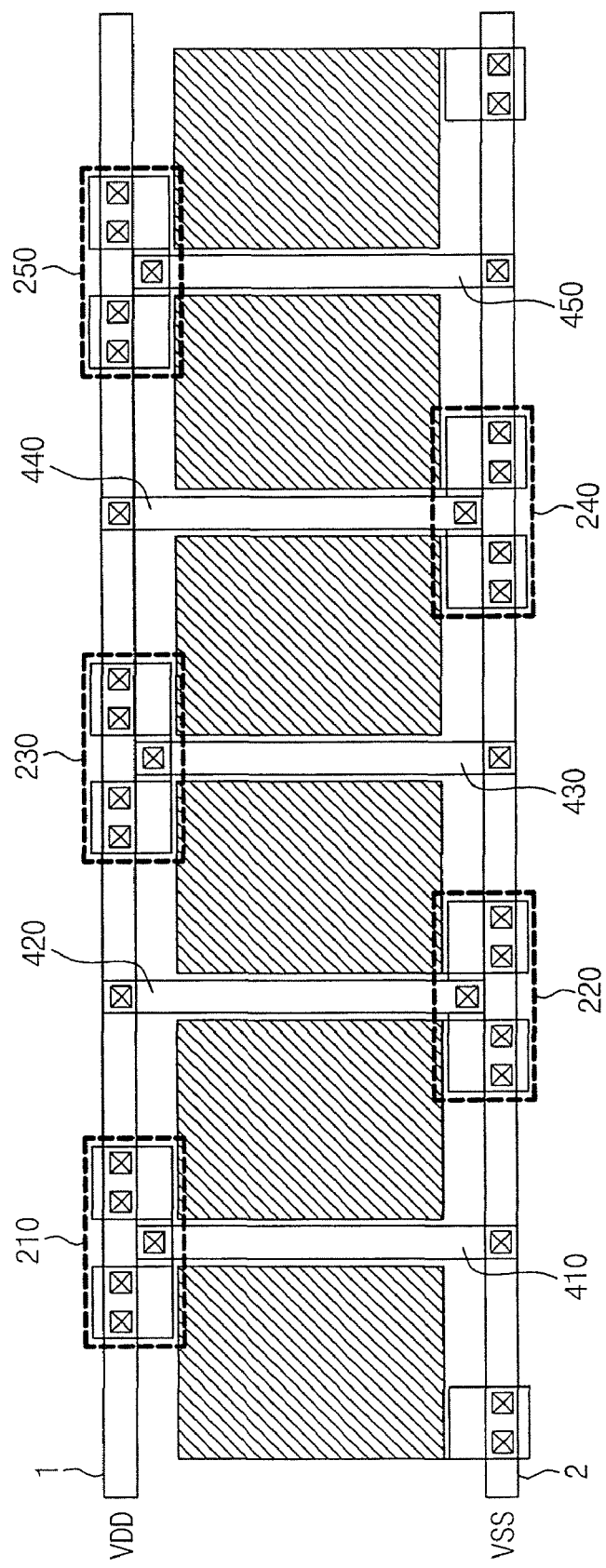
FIG. 3 is a layout of a semiconductor device according to another embodiment of the present invention, in which a plurality of pads and a plurality of metal lines are shown.

FIG. 3 shows a plurality of pads and a plurality of metal lines. In FIG. 3, the electrostatic discharge units are not shown although the power clamp units requiring a direct connection with the power voltage VDD line and the ground voltage VSS line are shown.

Referring to FIG. 3, it can be appreciated that a single metal line is formed between the adjacent two pads, and two power clamp units are disposed at the periphery of the single metal line to share the single metal line.

More specifically, first through fifth metal lines 410, 420, 430, 440, 450 are respectively formed between the pads. First, third, and fifth power clamp unit pairs 210, 230, 250 are disposed at the upper side of the pads and second and fourth power clamp unit pairs 220 and 240 are disposed at the lower side of the pads.

One side of the first, third and fifth metal lines 410, 430, 450 is connected to the ground voltage VSS line 2 disposed at the opposite side of the power clamp unit pairs 210, 230, 250 through the contacts and one sides of the second and fourth metal lines 420, 440 are connected to the power voltage VDD line 1 disposed at the opposite side of the power clamp unit pairs 220, 240 through contacts. In other words, the metal lines are alternatively connected to the power voltage VDD line 1 or the ground voltage VSS line.

The first through fifth power clamp unit pairs 210, 220, 230, 240, 250 have respectively a structure in that two power clamp units form a pair and share a single metal line to be supplied with the same voltage.

In other words, according to an embodiment of the present invention, two power clamp circuits form a pair that is to be supplied with a first voltage through the adjacent voltage line and a second voltage line from the shared metal line.

Since two power clamp units should share a single metal line as described above, the power clamp circuits are symmetrically disposed with respect to the metal line as shown in FIG. 3.

With the repetition of such structure, it is possible to reduce to half the metal line for the power supply, i.e. space occupied by the power line and thus to reduce to half the distance between the pads.

Further, since the space occupied by the power line is reduced, it is possible to increase signal lines to aid high-speed operation of semiconductor devices.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not deunit from the spirit and scope of the invention as set forth in the appended claims.

What is claimed is:

1. A semiconductor device, comprising:
pads disposed between a first voltage line and a second voltage line;
first and second driver units, both disposed at an upper portion or a lower portion of adjacent two pads; and
only one metal line disposed between the pads and supplying power commonly to the first and second driver units,
wherein the first and second driver units are adjacently disposed to share the only one metal line therebetween.

2. The semiconductor device as set forth in claim 1, wherein the only one metal line is formed with a first metal contact for an electrical connection with the first voltage line at one side of the only one metal line and a second metal contact for an electrical connection with the first and second driver units at the other side of the only one metal line.

3. The semiconductor device as set forth in claim 1, wherein the first voltage line is a power voltage line, and the second voltage line is a ground voltage line.

4. The semiconductor device as set forth in claim 1, wherein the first voltage line is a ground voltage line, and the second voltage line is a power voltage line.

5. The semiconductor device as set forth in claim 1, wherein each of the first and second driver units comprises a power clamp circuit, which is turned on to form a current path when a static electricity is applied to the corresponding first or second voltage line.

6. A semiconductor device, comprising:
first and second pads disposed between a first voltage line and a second voltage line;
a first driver unit formed at an upper portion of the first pad;
a second driver unit formed at a lower portion of the first pad in a diagonal direction of the first driver unit;
a third driver unit formed adjacently to the first driver unit at an upper portion of the second pad;

a fourth driver unit formed at a lower portion of the second pad in a diagonal direction of the third driver unit; and a metal line disposed between the first and second pads and supplying a voltage of the second voltage line to the first and third driver units.

7. The semiconductor device as set forth in claim 6, wherein the metal line is formed with a first contact for an electrical connection with the first and third driver units at one side of the metal line and a second contact for an electrical connection with the second voltage line at the other side of the metal line.

8. The semiconductor device as set forth in claim 6, wherein each of the first and third driver units is formed with a contact overlappedly disposed on the first voltage line and supplied a voltage from the first voltage line.

9. The semiconductor device as set forth in claim 6, wherein each of the second and fourth driver units is formed with a contact overlappedly disposed on the second voltage line and supplied the voltage from the second voltage line.

10. The semiconductor device as set forth in claim 6, wherein each of the first through fourth driver units comprises a power clamp circuit, which is turned on to form a current path when static electricity is applied to the first or second voltage line.

11. A semiconductor device, comprising:

a plurality of pairs of pads disposed between a first voltage line and a second voltage line wherein each pair of the plurality of pairs of pads comprises a first pad and a second pad;

a plurality of first driver units formed at upper portions of the plurality of pairs of pads;

a plurality of second driver units formed at lower portions of the plurality of pairs of pads;

a first metal line formed between the first pad and the second pad of each pair of pads and supplying a second voltage to the first driver unit; and a second metal line formed between two pairs of the plurality of pairs of pads and supplying a first voltage to the second driver unit.

12. The semiconductor device as set forth in claim 11, wherein each unit of the plurality of first driver units comprises a pair of drivers sharing the first metal line.

13. The semiconductor device as set forth in claim 11, wherein each unit of the plurality of second driver units comprises a pair of drivers sharing the second metal line.

14. The semiconductor device as set forth in claim 11, wherein each pair of the first and second driver units of the plurality of first driver units and the plurality of second driver units are disposed in a diagonal direction.

15. The semiconductor device as set forth in claim 11, wherein each of the first and second driver units comprises a power clamp circuit, which is turned on to form a current path when static electricity is applied to the first or second voltage line.

* * * * *